United States Patent
Kim et al.

(10) Patent No.: US 10,854,452 B2
(45) Date of Patent: Dec. 1, 2020

(54) METHOD OF MANUFACTURING SEMICONDUCTOR DEVICES

(71) Applicant: SAMSUNG ELECTRONICS CO., LTD., Suwon-si (KR)

(72) Inventors: Hyun Jo Kim, Seoul (KR); Se Wan Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/432,053

(22) Filed: Jun. 5, 2019

(65) Prior Publication Data

US 2020/0152461 A1 May 14, 2020

(30) Foreign Application Priority Data

Nov. 9, 2018 (KR) .................. 10-2018-0137287

(51) Int. Cl.
*H01L 21/033* (2006.01)
*H01L 21/308* (2006.01)
*H01L 21/8234* (2006.01)
*H01L 21/3213* (2006.01)

(52) U.S. Cl.
CPC ...... *H01L 21/0337* (2013.01); *H01L 21/3086* (2013.01); *H01L 21/32139* (2013.01); *H01L 21/823431* (2013.01); *H01L 21/823456* (2013.01)

(58) Field of Classification Search
CPC ......... H01L 27/0886; H01L 21/823431; H01L 29/66484; H01L 29/7851; H01L 29/785
See application file for complete search history.

(56) References Cited

U.S. PATENT DOCUMENTS

| | | | |
|---|---|---|---|
| 7,763,531 B2 | 7/2010 | Abadeer et al. | |
| 8,896,067 B2 | 11/2014 | Bergendahl et al. | |
| 9,196,540 B2 | 11/2015 | Chen | |
| 9,525,068 B1 | 12/2016 | Gupta et al. | |
| 9,786,788 B1 | 10/2017 | Anderson et al. | |
| 9,887,135 B1 | 2/2018 | Wallner et al. | |
| 2008/0070165 A1* | 3/2008 | Fischer | H01L 21/0338 430/314 |
| 2016/0336322 A1 | 11/2016 | Chen et al. | |
| 2017/0278870 A1 | 9/2017 | Cheng | |

FOREIGN PATENT DOCUMENTS

KR 10-1438285 B1 8/2014

* cited by examiner

*Primary Examiner* — Changhyun Yi
(74) *Attorney, Agent, or Firm* — Lee IP Law, P.C.

(57) ABSTRACT

A method of manufacturing a semiconductor device includes forming first sacrificial cores on a first region of a lower structure and second sacrificial cores on a second region of the lower structure, forming spacers on side walls of the first sacrificial cores and side walls of the second sacrificial cores, forming a protective pattern covering the second sacrificial cores on the second region of the lower structure, removing the first sacrificial cores from the first region, and etching the lower structure using the spacers on the first region, and the second sacrificial cores and the spacers on the second region. By using only spacers as an etching mask in the first region and the sacrificial cores with the spacers as an etching mask in the second region, patterns with different widths are formed simultaneously on the first and second regions.

19 Claims, 12 Drawing Sheets

METHOD OF MANUFACTURING SEMICONDUCTOR DEVICES

CROSS-REFERENCE TO RELATED APPLICATION

Korean Patent Application No. 10-2018-0137287, filed on Nov. 9, 2018, in the Korean Intellectual Property Office, and entitled: "Method of Manufacturing Semiconductor Devices," is incorporated by reference herein in its entirety.

BACKGROUND

1. Field

The present disclosure relates to a method of manufacturing a semiconductor device.

2. Description of the Related Art

As semiconductor devices become highly integrated, a size of patterns, forming the semiconductor device, becomes smaller and smaller. Due to limitations of the optical resolution of the photolithography equipment used to form such patterns, there is a limitation in forming a fine pattern. Accordingly, methods for forming a fine pattern have been proposed.

SUMMARY

According to an example embodiment, a method of manufacturing a semiconductor device includes forming first sacrificial cores on a first region of a lower structure and second sacrificial cores on a second region of the lower structure, forming spacers on side walls of the first sacrificial cores and side walls of the second sacrificial cores, forming a protective pattern covering the second sacrificial cores on the second region of the lower structure, removing the first sacrificial cores from the first region, and etching the lower structure using the spacers on the first region, and the second sacrificial cores and the spacers on the second region.

According to an example embodiment, a method of manufacturing a semiconductor device includes preparing a lower structure having a first region, a second region, and a third region, forming a first sacrificial core having a first width on the first region, a second sacrificial core having a second width on the second region, and a third sacrificial core having a third width, greater than the first width and the second width, on the third region, forming spacers on the first region of the lower structure, a first mask structure including the second sacrificial core and the spacers on the second region of the lower structure, and a second mask structure including the third sacrificial core and the spacers on the third region of the lower structure, and etching the lower structure using the spacers, the first mask structure, and the second mask structure.

According to an example embodiment, a method of manufacturing a semiconductor device includes stacking a lower sacrificial layer and an upper sacrificial layer on a lower structure having a first region, a second region, and a third region, forming a first upper sacrificial core on the first region and a second upper sacrificial core on the second region by etching the upper sacrificial layer, forming first spacers on side walls of the first upper sacrificial core and side walls of the second upper sacrificial core; removing the first upper sacrificial core and the second upper sacrificial core, forming a photoresist pattern having a width, wider than a width of the first upper sacrificial core, on the third region, forming first lower sacrificial cores on the first region, second lower sacrificial cores on the second region, and a third lower sacrificial core on the third region, by etching the lower sacrificial layer using the first spacers and the photoresist pattern as an etching mask, forming second spacers on side walls of first lower sacrificial cores, side walls of second lower sacrificial cores, and side walls of a third lower sacrificial core, forming a protective pattern covering the second region and the third region, removing the first lower sacrificial cores formed on the first region, and etching the lower structure using the second spacers on the first region, the second lower sacrificial cores and the second spacers on the second region, and the third lower sacrificial cores and the second spacers on the third region.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, exemplary embodiments will be described in detail with reference to the attached drawings.

Figure 1:
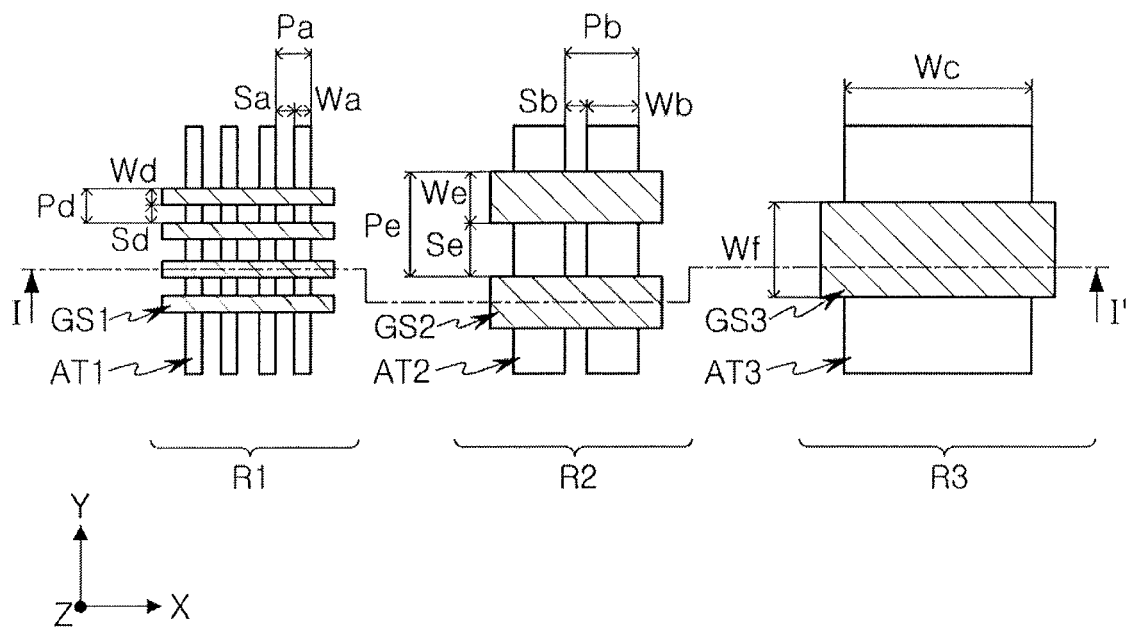
FIGS. 1 and 2 illustrate a plan view and a cross-sectional view, respectively, of a semiconductor device manufactured by a method according to an example embodiment.
Figure 2:
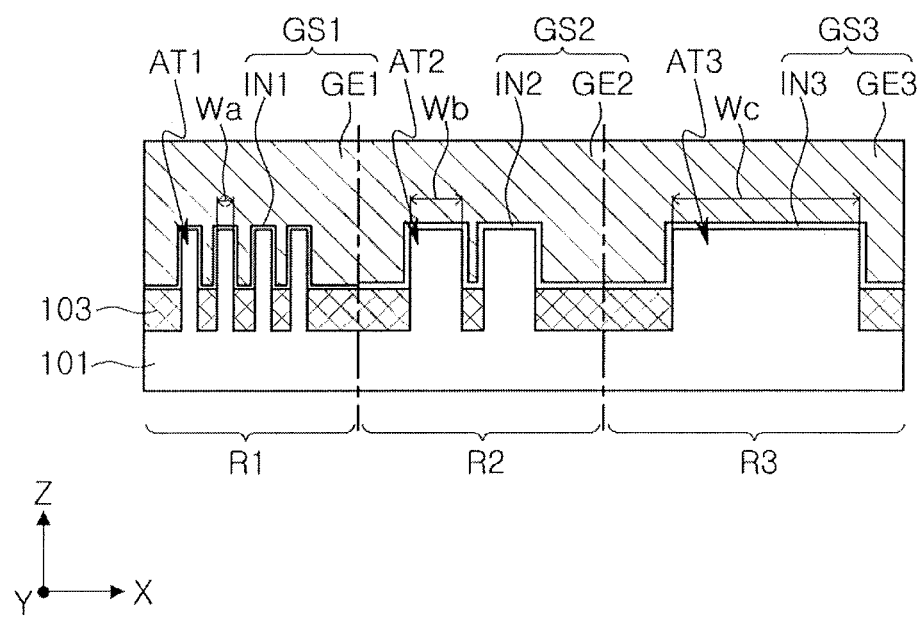

FIGS. 1 and 2 are a plan view and a cross-sectional view illustrating a semiconductor device manufactured by a method of manufacturing a semiconductor device according to an example embodiment. FIG. 2 is a cross-sectional view along line I-I' of FIG. 1.

Referring to FIGS. 1 and 2, a substrate 101 may have a first region R1, a second region R2, and a third region R3. The first region R1 may be a region in which core transistors having a finFET structure are formed. The second region R2 may be a region in which I/O transistors having a FinFET structure and/or laterally diffused MOSFET (LDMOS) transistors having a FinFET structure, using a voltage higher than that of core transistors, are formed. The third region R3 may be a region in which planar transistors are formed.

First active regions AT1 extended in one direction may be formed on the first region R1 of the substrate 101, second active regions AT2 extended in one direction may be formed on the second region R2, and at least a single third active region AT3 extended in one direction may be formed on the third region R3. For example, as illustrated in FIG. 1, the first active regions AT1, the second active regions AT2, and the third active region AT3 may be extended in a same direction, e.g., along the y-direction. In another example, in a manner different from that illustrated in FIG. 1, the first active regions AT1, the second active regions AT2, and the third active regions AT3 may be extended in directions different from each other.

The first active region AT1 may be a first active fin, while the second active region AT2 may be a second active fin. The first active regions AT1 may be disposed at a first pitch Pa, while the second active regions AT2 may be disposed at a second pitch Pb, greater than the first pitch Pa. A second width Wb of the second active regions AT2 may be greater than a first width Wa of the first active regions AT1, while a third width Wc of the third active regions AT3 may be greater than the second width Wb of the second active regions AT2. The second width Wb of the second active regions AT2 may be greater than twice the first width Wa of the first active regions AT1. The second space Sb of the second active regions AT2 may be equal to the first space Sa of the first active regions AT1, or may be greater than the first space Sa of the first active regions AT1. As illustrated in FIG. 1, the first pitch Pa equals the sum of the first width Wa of a single first active region AT1 and the first space Sa (i.e., a space between two adjacent first active regions AT1), and the second pitch Pb equals the sum of the second width Wb of a single second active region AT2 and the second space Sb (i.e., a space between two adjacent second active regions AT2).

As illustrated in FIG. 2, a device isolation layer 103 may be formed between adjacent ones of the first to third active regions AT1, AT2, and AT3. Upper portions of the first to third active regions AT1, AT2, and AT3 may protrude over upper surface of the device isolation layer 103. The device isolation layer 103 may cover side surfaces of lower portions of the first to third active regions AT1, AT2, and AT3.

First gate structures GS1 may be formed on the first region R1 of the substrate 101, second gate structures GS2 may be formed on the second region R2, and third gate structures GS3 may be formed on the third region R3. The first gate structures GS1 may be extended in a direction intersecting the first active regions AT1, the second gate structures GS2 may be extended in a direction intersecting the second active regions AT2, and the third gate structures GS3 may be extended in a direction intersecting the third active regions AT3. For example, the first gate structures GS1, the second gate structures GS2, and the third gate structures GS3 may be extended along the x-direction.

The first gate structures GS1 may be disposed at a fourth pitch Pd, while the second gate structures GS2 may be disposed at a fifth pitch Pe, greater than the fourth pitch Pd. A second width We of the second gate structures GS2 may be greater than a first width Wd of the first gate structures GS1, while a third width Wf of the third gate structures GS3 may be greater than the second width We of the second gate structures GS2. The second width We of the second gate structures GS2 may be greater than twice the first width Wd of the first gate structures GS1. The second space Se of the second gate structures GS2 may be equal to the first space Sd of the first gate structures GS1, or may be greater than the first space Sd of the first gate structures GS1. In an example embodiment, the first gate structures GS1 and the second gate structures GS2 may have widths and spaces, equal to each other.

Source/drain regions may be formed on both, e.g., opposite, sides of, e.g., each of, the first gate structures GS1, the second gate structures GS2, and the third gate structures GS3. The source/drain regions may grow from the first active regions AT1, the second active regions AT2, and the third active region AT3, using a selective epitaxial growth (SEG) process, or may be formed in upper regions of the first active regions AT1, the second active regions AT2, and the third active region AT3, using an ion implantation process.

The first gate structures GS1 include a first gate insulating layer IN1 and a first gate electrode layer GE1, the second gate structures GS2 include a second gate insulating layer IN2 and a second gate electrode layer GE2, and the third gate structure GS3 includes a third gate insulating layer IN3 and a third gate electrode layer GE3.

A thickness of the second gate insulating layer IN2 may be greater than a thickness of the first gate insulating layer IN1. A thickness of the third gate insulating layer IN3 may be greater than the thickness of the first gate insulating layer IN1. Each of the first gate insulating layer IN1, the second gate insulating layer IN2, and the third gate insulating layer IN3 may include, e.g., a silicon oxide, a silicon oxynitride, a high-k oxide, or a combination thereof. The high-k oxide may be, e.g., one among aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$) lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

Each of the first gate insulating layer GE1, the second gate insulating layer GE2, and the third gate insulating layer GE3 may include, e.g., a metal, a metal nitride, doped polycrystalline silicon, or a combination thereof. In an example embodiment, the first gate electrode layer GE1, the second gate electrode layer GE2, and the third gate electrode layer GE3 may include at least one among, e.g., titanium nitride (TiN), titanium aluminum (TiAl), titanium aluminum nitride (TiAlN), tantalum nitride (TaN), tantalum aluminum nitride (TaAlN), aluminum titanium carbide (TiAlC), tungsten nitride (WCN), and tungsten (W).

According to an example embodiment, as a width of the second active region AT2 of the second region R2 may be further increased as compared with a width of the first active region AT1 of the first region R1, reliability of hot carrier immunity (HCI) of I/O transistors having a FinFET structure or laterally diffused MOSFET (LDMOS) transistors having a FinFET structure, using a voltage higher than that of core transistors may be improved.

FIGS. 3 to 8 are cross-sectional views illustrating stages in a method of manufacturing a semiconductor device according to an example embodiment. The cross-sectional views in FIGS. 3 to 8 correspond to that of FIG. 2.

Figure 3:
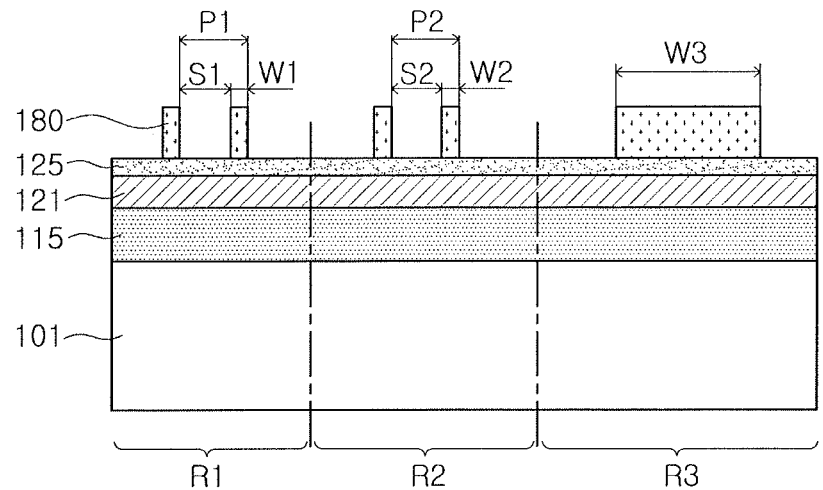
FIGS. 3 to 8 illustrate cross-sectional views of stages in a method of manufacturing a semiconductor device according to an example embodiment.

Referring to FIG. 3, on the substrate 101, a hard mask layer 115, a sacrificial layer 121, and an antireflection layer 125 may be sequentially formed.

The substrate 101 may have the first region R1, the second region R2, and the third region R3. The first region R1 may be a region in which core transistors having a finFET structure are formed. The second region R2 may be a region in which I/O transistors having a FinFET structure or laterally diffused MOSFET (LDMOS) transistors having a FinFET structure, using a voltage higher than that of core transistors, are formed. The third region R3 may be a region in which planar transistors are formed.

The substrate 101 may be a semiconductor substrate, e.g., a silicon wafer. For example, the substrate 101 may be a Silicon-On-Insulator (SOI) substrate.

The hard mask layer 115 may be formed of at least one among a silicon-containing material, e.g., silicon oxide ($SiO_x$), silicon oxynitride (SiON), silicon nitride ($Si_xN_y$), or polycrystalline silicon, a carbon-containing material, e.g., an amorphous carbon layer (ACL) or a spin-on hardmask (SOH), or a metal. For example, the hard mask layer 115 may include a plurality of layers.

The sacrificial layer 121 may include at least one among, e.g., polycrystalline silicon, an amorphous carbon layer (ACL), or a spin-on hard mask (SOH). The sacrificial layer 121 may be between the hard mask layer 115 and the antireflection layer 125.

The antireflection layer 125 may be at least one layer for preventing reflection of light during a photolithography process. The antireflection layer 125 may be formed of, e.g., a silicon oxynitride film (SiON).

The hard mask layer 115, the sacrificial layer 121, and the antireflection layers 125 may be formed using, e.g., an atomic layer deposition (ALD), chemical vapor deposition (CVD), spin coating, or the like. A bake process or a curing process may be additionally performed depending on a material.

Then, a photoresist may be formed on the antireflection layer 125. Photoresist patterns 180, e.g., in the form of lines spaced apart from each other, may be formed on the antireflection layer 125 using a photolithography process.

First patterns of the photoresist patterns 180 may be formed on the first region R1 to have a first space S1 therebetween, while having a first width W1. The first patterns of the photoresist patterns 180 may be formed on the first region R1 with a first pitch P1. The first pitch P1 may be defined as a sum of the first width W1 and the first space S1.

Second patterns of the photoresist patterns 180 may be formed on the second region R2 with a second space S2 therebetween, while having a second width W2. The second patterns of the photoresist patterns 180 may be formed on the second region R2 with a second pitch P2. The second pitch P2 may be defined as a sum of the second width W2 and the second space S2. The second width W2 may be different from the first width W1. The second space S2 may be different from the first space S1.

Third patterns of the photoresist patterns 180 may be formed on the third region R3 while having a third width W3. The first width W1 may be determined in consideration of the space Sa between the first active regions (AT1, see FIG. 6) to be ultimately formed. The space Sa between the first active regions AT1, to be ultimately formed, may be narrower than a resolution limit of a commercially available photolithography equipment.

Figure 4:
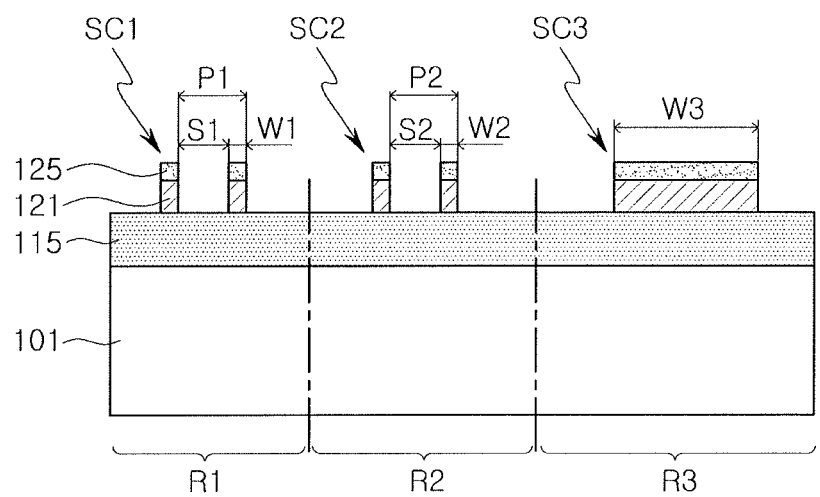

Referring to FIG. 4, the antireflection layer 125 and the sacrificial layer 121 may be anisotropically etched using the photoresist patterns 180 as an etching mask. Thus, first sacrificial cores SC1 may be formed on the first region R1, second sacrificial cores SC2 may be formed on the second region R2, and third sacrificial core SC3 may be formed on the third region R3. The first sacrificial cores SC1 may be formed on the first region R1 with the first width W1 and the first space S1 therebetween, i.e., the first pitch P1. The second sacrificial cores SC2 may be formed on the second region R2 with the second width W2 and the second space S2 therebetween, i.e., the second pitch P2. The third sacrificial cores SC3 may have the third width W3 on the third region R3. The third width W3 of the third sacrificial core SC3 may be greater than each of the first width W1 of the first sacrificial cores SC1 and the second width W2 of the second sacrificial cores SC2.

Figure 5:
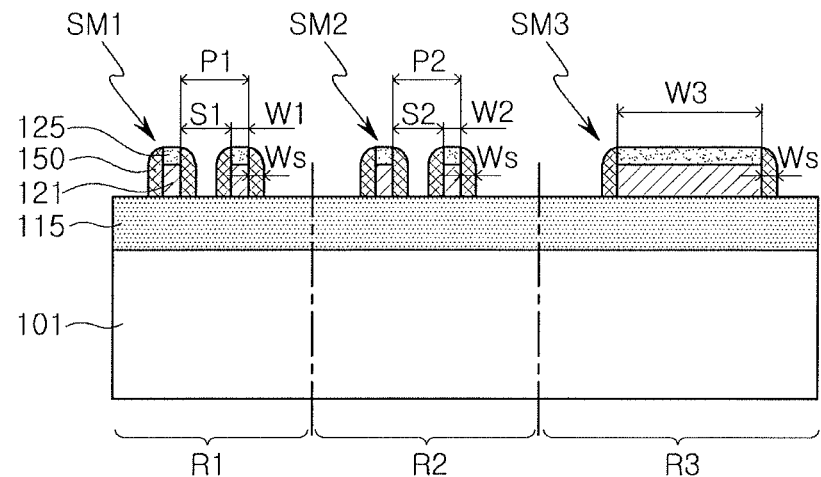

Referring to FIG. 5, spacers 150 may be formed on side walls of the first sacrificial cores SC1, side walls of the second sacrificial cores SC2, and side walls of the third sacrificial core SC3. Thus, first mask structures SM1 may be formed on the first region R1, second mask structures SM2 may be formed on the second region R2, and a third mask structure SM3 may be formed on the third region R3. Each of the first mask structures SM1, the second mask structures SM2, and the third mask structure SM3 may include a lower sacrificial layer 121, a lower antireflection layer 125, and a pair of second spacers 150.

In detail, a spacer material layer, conformally covering the first sacrificial cores SC1, the second sacrificial cores SC2, and the third sacrificial core SC3, may be formed. Then, an etchback process may be performed to form the spacers 150 on opposite side walls of each of the first sacrificial cores SC1, opposite side walls of each of the second sacrificial cores SC2, and opposite side walls of the third sacrificial core SC3.

A thickness of the spacer material layer, i.e., a thickness of the spacers 150, may be determined in consideration of the width Wa of the first active regions (AT1, see FIG. 7), to be ultimately formed. The width Wa of the first active regions AT1, to be ultimately formed, may be narrower than a resolution limit of a commercially available photolithography equipment.

The spacer material layer may be formed of a material having etch selectivity with respect to a material of the sacrificial layer 121. For example, when the sacrificial layer 121 is formed of one among polycrystalline silicon, an amorphous carbon layer (ACL), or a spin-on hardmask (SOH), the spacer material layer may be formed of a silicon oxide or a silicon nitride. The spacer material layer may be formed using atomic layer deposition (ALD).

Figure 6:
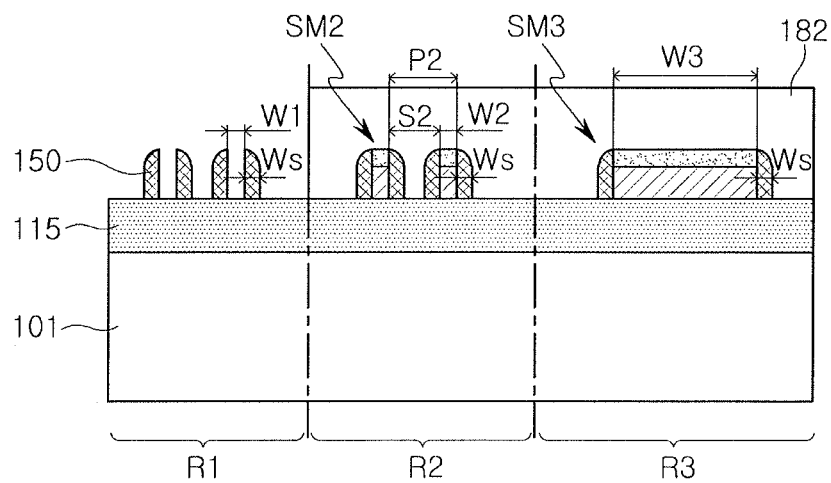

Referring to FIG. 6, a protective pattern 182, covering the second region R2 and the third region R3, may be provided. The protective pattern 182 may be formed of, e.g., a photoresist material. The protective pattern 182 covers the second mask structures SM2 of the second region R2 and the third mask structure SM3 of the third region R3, such that the first mask structures SM1 may be exposed on the first region R1.

Next, the first sacrificial cores SC1 may be removed from the exposed first region R1, such that the spacers 150 may remain on the hard mask layer 115 of the first region R1. The spacers 150 may be disposed on the first region R1 to be spaced apart from each other at a distance equal to the first width W1 of the first sacrificial core SC1.

Figure 7:
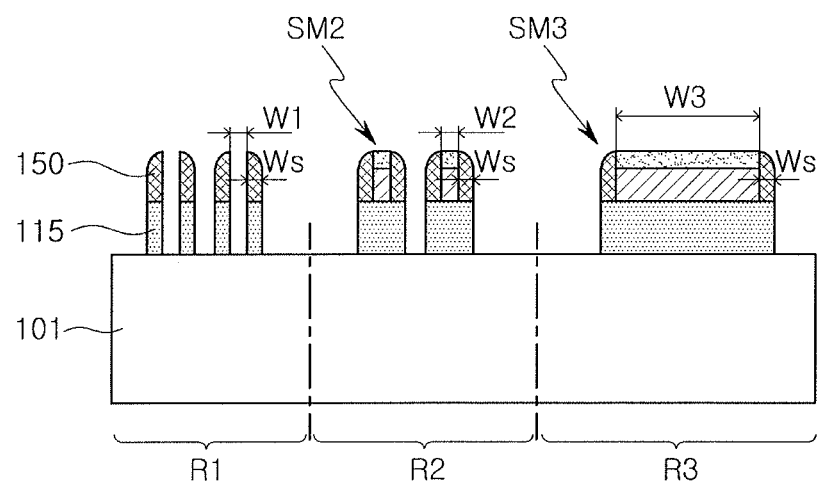

Referring to FIG. 7, the protective pattern 182 may be removed. Then, the hard mask layer 115 may be anisotropically etched using the spacers 150 on the first region R1, the second mask structure SM2 on the second region R2, and the third mask structure SM3 on the third region R3 as an etching mask. While the hard mask layer 115 may be anisotropically etched, a portion or the entirety of the spacers 150, the second mask structure SM2, and the third mask structure SM3, may be consumed.

Figure 8:
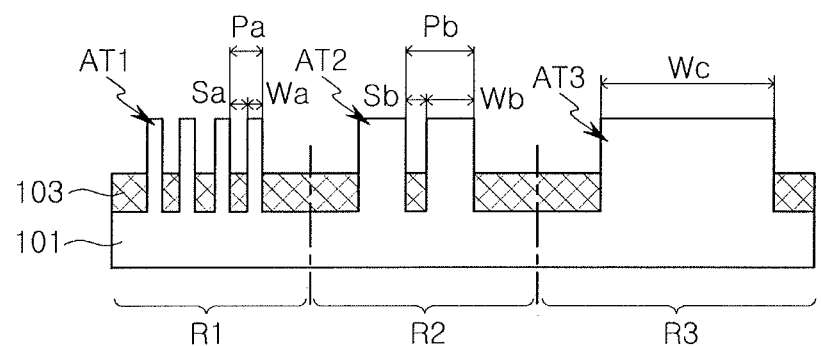

Referring to FIG. 8, the substrate 101 may be anisotropically etched, using the patterned hard mask layer 115 as an etching mask, to form the first active regions AT1 on the first region R1 of the substrate 101, to form the second active regions AT2 on the second region R2, and to form the third active region AT3 on the third region R3. The first active region AT1 may be the first active fin, while the second active region AT2 may be the second active fin. The second width Wb of the second active regions AT2 may be greater than the first width Wa of the first active regions AT1, while the third width Wc of the third active regions AT3 may be greater than the second width Wb of the second active regions AT2. The second width Wb of the second active regions AT2 may be greater than twice the first width Wa of the first active regions AT1. The second space Sb of the second active regions AT2 may be equal to the first space Sa of the first active regions AT1, or may be greater than the first space Sa of the first active regions AT1.

In an example embodiment, when the first width W1 of the first sacrificial core SC1 may be equal to the second width W2 of the second sacrificial core SC2, and the width Ws of the spacers 150 may be equal to the first width W1 of the first sacrificial core SC1, the second width Wb of the second active regions AT2 may be equal to three times the first width Wa of the first active regions AT1. In other words, referring to FIGS. 7-8, the second width Wb of each of the second active region AT2 (FIG. 8) may equal a sum of the second width W2 of the second sacrificial core SC2 and two widths Ws of two spacers 150 on sidewalls of the second sacrificial core SC2 (FIG. 7).

After the anisotropic etching of the substrate 101 is completed, a portion of the hard mask layer 115 may remain on the first to third active regions AT1, AT2, and AT3. The device isolation layer 103 may be formed to allow upper portions of the first to third active regions AT1, AT2, and AT3 to protrude. In detail, a space between adjacent ones of the first to third active regions AT1, AT2, and AT3 may be filled with the device isolation layer 103. The hard mask layer 115, remaining on the first to third active regions AT1, AT2, and AT3, may be removed, and then a portion of the device isolation layer 103 may be etched to a predetermined depth to allow upper portions of the first to third active regions AT1, AT2, and AT3 to protrude.

According to an example embodiment, the first to third active regions AT1, AT2, and AT3, having different widths, may be simultaneously formed in the first to third regions R1, R2, and R3, and a width of the second active region AT2 may be increased in the second region R2, in which I/O transistors having a FinFET structure or laterally diffused MOSFET (LDMOS) transistors having a FinFET structure, using a voltage higher than that of core transistors, are formed. Thus, reliability of hot carrier immunity (HCI) of I/O transistors or laterally diffused MOSFET (LDMOS) transistors may be improved.

FIGS. 9 to 14 are cross-sectional views illustrating stages in a method of manufacturing a semiconductor device according to an example embodiment. The cross-sectional views in FIGS. 9 to 14 correspond to that of FIG. 2.

Figure 9:
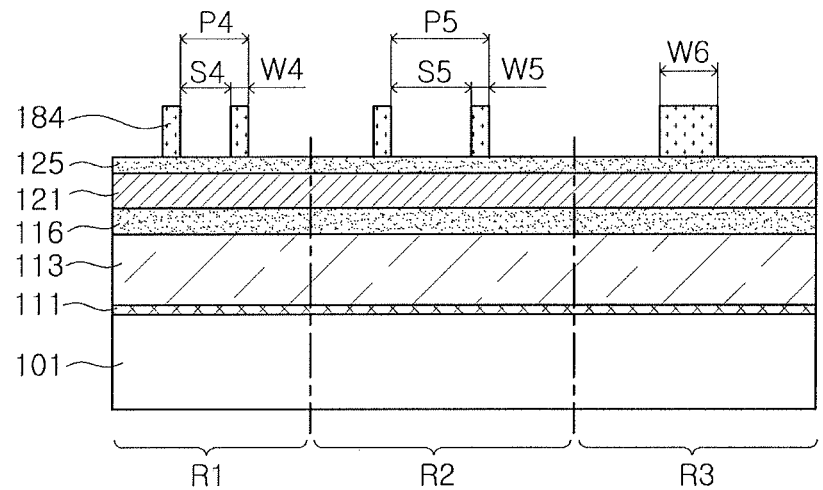
FIGS. 9 to 14 illustrate cross-sectional views of stages in a method of manufacturing a semiconductor device according to an example embodiment.

Referring to FIG. 9, on the substrate 101, a gate insulating layer 111, a gate conductive layer 113, a hard mask layer 116, the sacrificial layer 121, and the antireflection layer 125 may be sequentially formed. Then, a photoresist may be formed on the sacrificial layer 121, followed by formation of photoresist patterns 184 in the form of a line using a photolithography process.

First patterns of the photoresist patterns 184 may be formed on the first region R1 with a fourth space S4 therebetween, while having a fourth width W4. The first patterns of the photoresist patterns 184 may be formed on the first region R1 with a fourth pitch P4. Second patterns of the photoresist patterns 184 may be formed on the second region R2 with a fifth space S5 therebetween, while having a fifth width W5. The second patterns of the third photoresist patterns 184 may be formed on the second region R2 with a fifth pitch P5. The fifth width W5 may be different from the fourth width W4. The fifth space S5 may be different from the fourth space S4. Third patterns of the photoresist patterns 184 may be formed on the third region R3 while having a sixth width W6. The fourth width W4 may be determined in consideration of the space Sd between the first gate patterns (GT1, see FIG. 14) to be ultimately formed. The space Sd between the first gate patterns GT1, to be ultimately formed, may be narrower than a resolution limit of a commercially available photolithography equipment.

Figure 10:
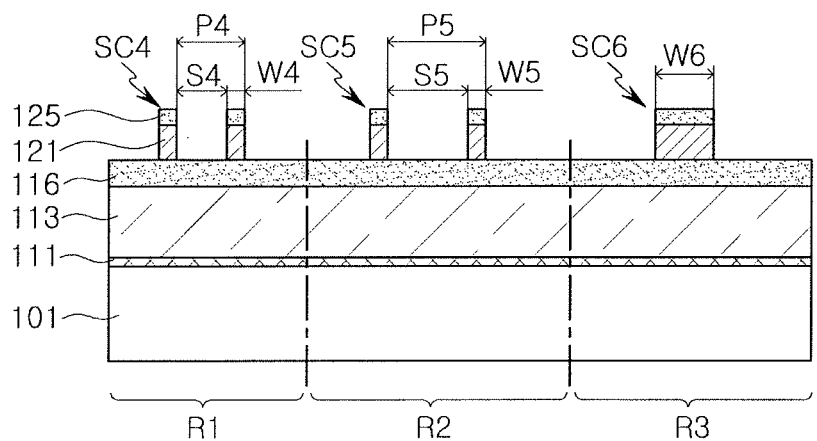

Referring to FIG. 10, the antireflection layer 125 and the sacrificial layer 121 may be anisotropically etched using the third photoresist patterns 184 as an etching mask, to form the fourth sacrificial cores SC4 on the first region R1, to form the fifth sacrificial cores SC5 on the second region R2, and to form the sixth sacrificial core SC6 on the third region R3. The fourth sacrificial cores SC4 may be formed on the first region R1 with the fourth width W4 and the fourth space S4, i.e., the fourth pitch P4. The fifth sacrificial cores SC5 may be formed on the second region R2 in the fifth width W5 and the fifth space S5, i.e., the fifth pitch P5. The sixth sacrificial core SC6 may have the sixth width W6 on the third region R3. The sixth width W6 of the sixth sacrificial core SC6 may be greater than the fourth width W4 of the fourth sacrificial cores SC4 and the fifth width W5 of the fifth sacrificial cores SC5.

Figure 11:
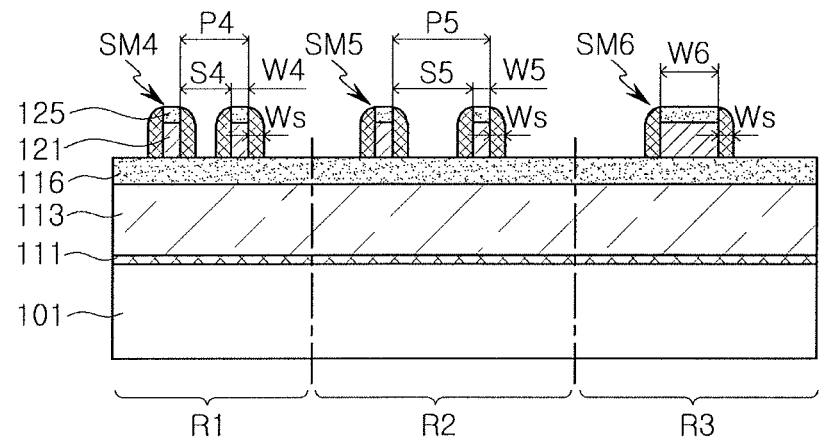

Referring to FIG. 11, the spacers 150 may be formed on side walls of the fourth sacrificial cores SC4, side walls of the fifth sacrificial cores SC5, and side walls of the sixth sacrificial core SC6. Thus, fourth mask structures SM4 may be formed on the first region R1, fifth mask structures SM5 may be formed on the second region R2, and a sixth mask structure SM6 may be formed on the third region R3. Each of the fourth mask structures SM4, the fifth mask structures SM5, and the sixth mask structure SM6 may include the sacrificial layer 121, the antireflection layer 125, and the pair of spacers 150.

In detail, a spacer material layer, conformally covering the fourth sacrificial cores SC4, the fifth sacrificial cores SC5, and the sixth sacrificial core SC6, may be formed. Then, an etchback process may be performed to form the spacers 150 on side walls of the fourth sacrificial cores SC4, side walls of the fifth sacrificial cores SC5, and side walls of the sixth sacrificial core SC6.

A thickness of the spacer material layer, i.e., a thickness of the spacers 150, may be determined in consideration of the width Wd of the first gate patterns (GT1, see FIG. 14), to be ultimately formed. The width Wd between the first gate patterns AT1, to be ultimately formed, may be narrower than a resolution limit of a commercially available photolithography equipment.

Figure 12:
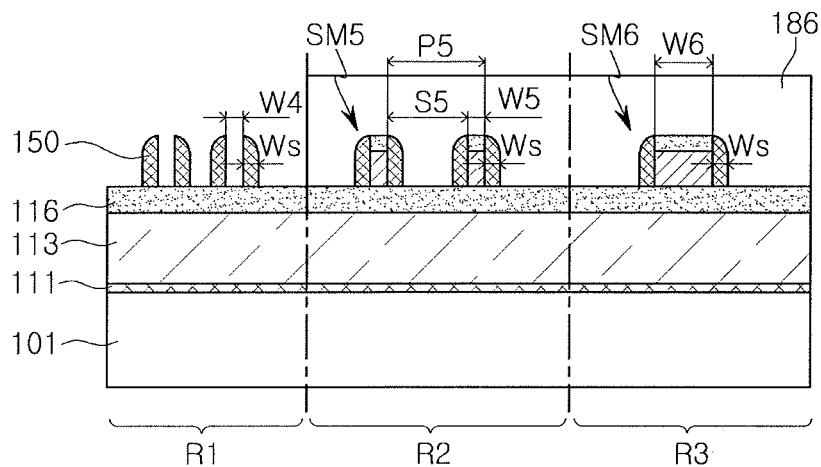

Referring to FIG. 12, a protective pattern 186, covering the second region R2 and the third region R3, may be provided. The protective pattern 186 may be formed of, e.g., a photoresist material. The protective pattern 186 covers the fifth mask structures SM5 of the second region R2 and the sixth mask structure SM6 of the third region R3, and exposes the fourth mask structures SM4.

By removing the fourth sacrificial cores SC4, spacers 150, remaining on the hard mask layer 115 of the first region R1, may be provided. The spacers 150 may be disposed in a space, equal to the fourth width W4 of the fourth sacrificial core SC4.

Figure 13:
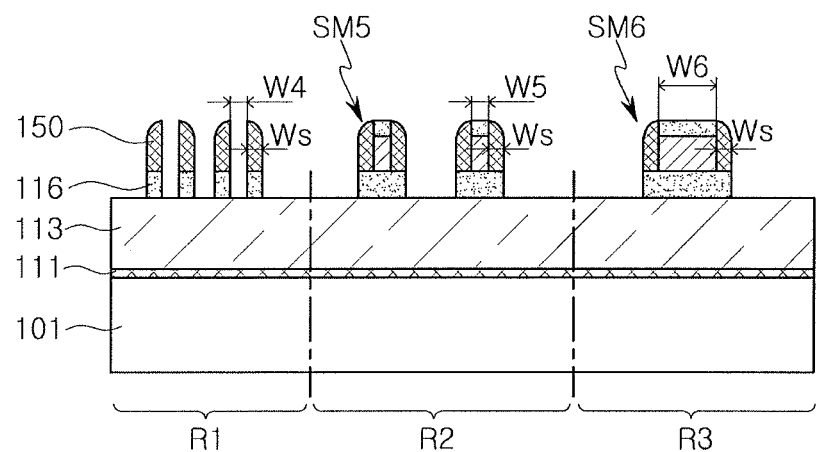

Referring to FIG. 13, the hard mask layer 116 may be anisotropically etched using the spacers 150 on the first region R1, the fifth mask structure SM5 on the second region R2, and the sixth mask structure SM6 on the third region R3 as etching masks. While the hard mask layer 116 may be anisotropically etched, a portion or the entirety, of the spacers 150, the fifth mask structure SM5, and the sixth mask structure SM6, may be consumed.

Figure 14:
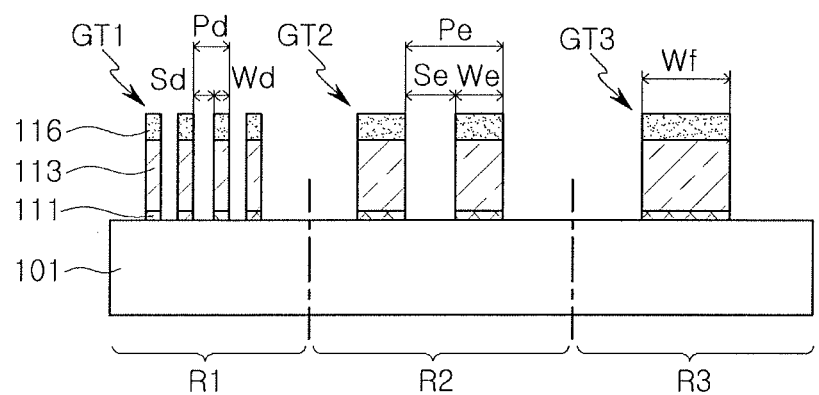

Referring to FIG. 14, the gate conductive layer 113 and the gate insulating layer 111 may be anisotropically etched using the patterned hard mask layer 116 as an etching mask, to form first gate patterns GT1 on the first region R1 of the substrate 101, to form the second gate patterns GT2 on the second region R2, and to form the third gate patterns GT3 on the third region R3. The second width We of the second gate patterns GT2 may be greater than the first width Wd of the first gate patterns GT1, while the third width Wf of the third gate patterns GT3 may be greater than the second width We of the second gate patterns GT2. The second width We of the second gate patterns GT2 may be greater than twice the first width Wd of the first gate patterns GT1. The second space Se of the second gate patterns GT2 may be equal to the first space Sd of the first gate patterns GT1, or may be greater than the first space Sd of the first gate patterns GT1.

According to an example embodiment, the first to third gate patterns GT1, GT2, and GT3, having different widths, may be simultaneously formed in the first to third regions R1, R2, and R3. The first to third gate patterns GT1, GT2, and GT3 may be substituted with the first to third gate structures GS1, GS2, and GS3 of FIGS. 1 and 2, by performing a gate replacement process.

FIGS. 15 to 23 are cross-sectional views illustrating stages in a method of manufacturing a semiconductor device according to an example embodiment. The cross-sectional views in FIGS. 15 to 23 correspond to that of FIG. 2.

Figure 15:
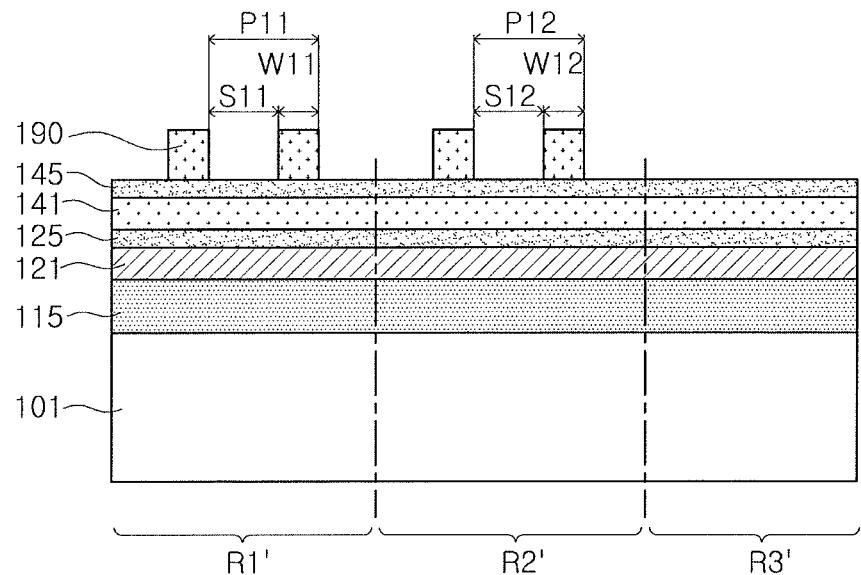
FIGS. 15 to 23 illustrate cross-sectional views of stages in a method of manufacturing a semiconductor device according to an example embodiment.

Referring to FIG. 15, on the substrate 101, the hard mask layer 115, the sacrificial layer 121, the antireflection layer 125, an upper sacrificial layer 141, and an upper antireflection layer 145 may be sequentially formed.

The substrate 101 may be a semiconductor substrate, e.g., a silicon wafer. For example, the substrate 101 may be a Silicon-On-Insulator (SOI) substrate.

The hard mask layer 115 may be formed of at least one among a silicon-containing material, e.g., silicon oxide ($SiO_x$), silicon oxynitride (SiON), silicon nitride ($Si_xN_y$), or polycrystalline silicon, a carbon-containing material, e.g., an amorphous carbon layer (ACL) or a spin-on hardmask (SOH), or a metal. For example, the hard mask layer 115 may include a plurality of layers.

The sacrificial layer 121 and the upper sacrificial layer 141 may each include at least one of, e.g., polycrystalline silicon, an amorphous carbon layer (ACL), or a spin-on hard mask (SOH).

The antireflection layer 125 and the upper antireflection layer 145 may be layers for preventing reflection of light during a photolithography process. The antireflection layer 125 and the upper antireflection layer 145 may be formed of, e.g., a silicon oxynitride film (SiON).

The hard mask layer 115, the sacrificial layers 121 and 141, and the antireflection layers 125 and 145 may be formed using, e.g., an atomic layer deposition (ALD), chemical vapor deposition (CVD), spin coating, or the like. A bake process or a curing process may be additionally performed depending on a material. Then, a photoresist may be formed on the upper sacrificial layer 141, and then first photoresist patterns 190 in the form of a line may be formed using a photolithography process.

The substrate 101 may have a first region R1', a second region R2', and a third region R3'. The first region R1' may be a region in which core transistors are formed, the second region R2' may be a region in which I/O transistors or laterally diffused MOSFET (LDMOS) transistors, using a voltage higher than that of core transistors, are formed, and the third region R3' may be a region in which planar transistors are formed.

First patterns of the first photoresist patterns 190 may be formed on the first region R1' in a first space S11 while having a first width W11. First patterns of the first photoresist patterns 190 may be formed on the first region R1' in a first pitch P11. The first pitch P11 may be defined as a sum of the first width W11 and the first space S11. Second patterns of the first photoresist patterns 190 may be formed on the second region R2' in a second space S12 while having a second width W12. Second patterns of the first photoresist patterns 190 may be formed on the second region R2' in a second pitch P11. The second pitch P12 may be defined as a sum of the second width W12 and the second space S12. The second width W12 may be different from the first width W11. The second space S12 may be different from the first space S11.

Figure 16:
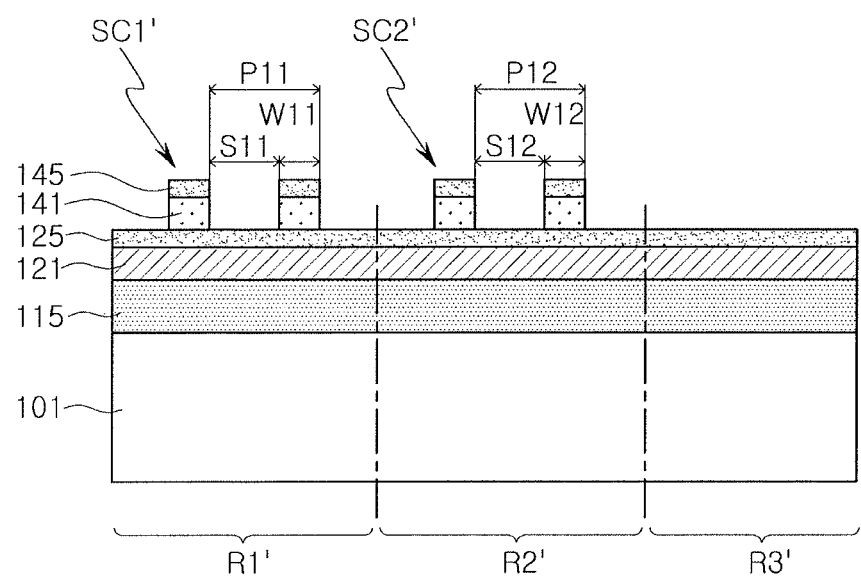

Referring to FIG. 16, the upper antireflection layer 145 and the upper sacrificial layer 141 may be anisotropically etched using the first photoresist patterns 190 as an etching mask, to form the first upper sacrificial cores SC1' on the first region R1', and to form the second upper sacrificial cores SC2' on the second region R2'. The first upper sacrificial cores SC1' may be formed on the first region R1' in the first width W11 and the first space S11, i.e., the first pitch P11. The second upper sacrificial cores SC2' may be formed on the second region R2' in the second width W12 and the second space S12, i.e., the second pitch P12.

Figure 17:
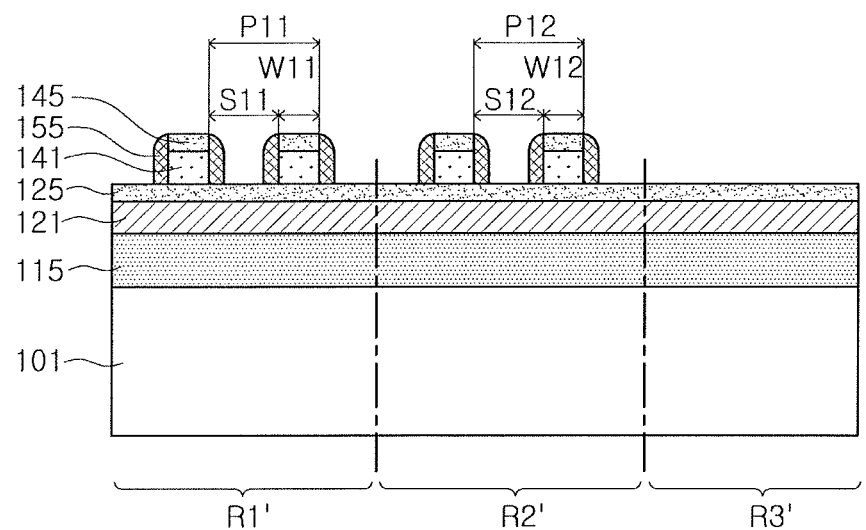

Referring to FIG. 17, first spacers 155 may be provided on side walls of the first upper sacrificial cores SC1' and side walls of the second upper sacrificial cores SC2'. In detail, a first spacer material layer, conformally covering the first upper sacrificial cores SC1' and the second upper sacrificial cores SC2', may be formed, and then an etchback process is performed to form the first spacers 155 on side walls of the first upper sacrificial cores SC1' and side walls of the second upper sacrificial cores SC2'.

A thickness of the first spacer material layer may be determined in consideration of a space Sa' between the first active regions (AT1', see FIG. 23) to be ultimately formed. A space Sa' between the first active regions AT1', to be ultimately formed, may be narrower than a resolution limit of a commercially available photolithography equipment.

The first spacer material layer may be formed of a material having etch selectivity with respect to a material of the upper sacrificial layer 141. For example, when the upper sacrificial layer 141 may be formed of one among, e.g., polycrystalline silicon, an amorphous carbon layer (ACL), or a spin-on hardmask (SOH), the first spacer material layer may be formed of, e.g., a silicon oxide or a silicon nitride. The first spacer material layer may be formed using atomic layer deposition (ALD).

Figure 18:
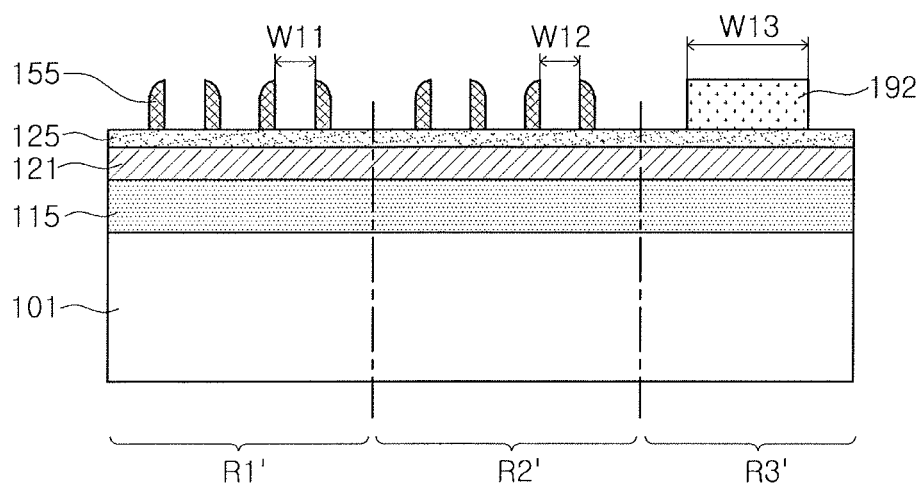

Referring to FIG. 18, the first upper sacrificial cores SC1' and the second upper sacrificial cores SC2' may be removed selectively with respect to the first spacers 155, the first spacers 155, independently remaining on the sacrificial layer 121, may be provided. Moreover, a second photoresist pattern 192 having a third width W13, wider than the first width W11 of the first upper sacrificial cores SC1', may be formed on the third region R3'. A third width W13 of the second photoresist pattern 192 may be an element ultimately determining a width Wc' of the third active regions AT3'. In this regard, a width W13 of the second photoresist pattern 192 may be adjusted, thereby freely adjusting a width Wc' of the third active regions AT3'.

Figure 19:
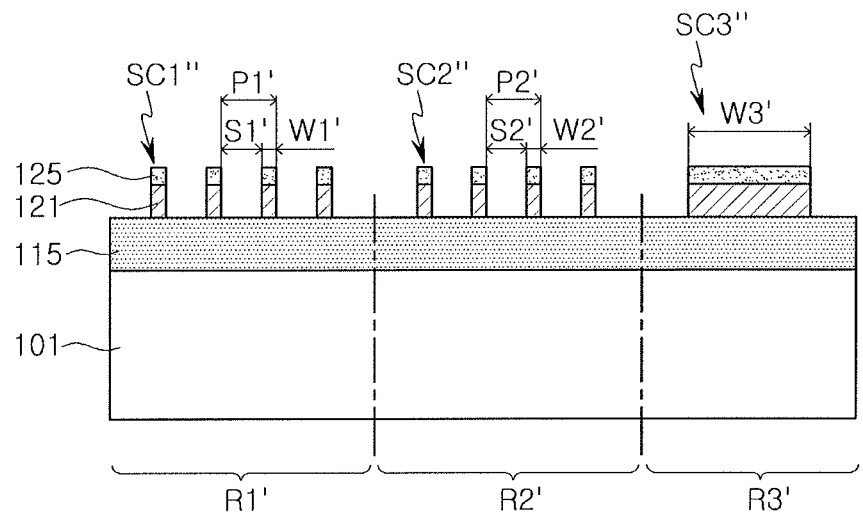

Referring to FIG. 19, first lower sacrificial cores SC1" may be formed on the first region R1', second lower sacrificial cores SC2" may be formed on the second region R2', and third lower sacrificial core SC3" may be formed on the third region R3'. The antireflection layer 125 and the sacrificial layer 121 may be etched using the first spacers 155 and the second photoresist pattern 192 as an etching mask. Thus, on the hard mask layer 115, the first lower sacrificial cores SC1", the second lower sacrificial cores SC2", and the third lower sacrificial core SC3" may be formed. The first lower sacrificial cores SC1" and the second lower sacrificial cores SC2" may be formed in a position corresponding to that of the first spacers 155, and a third lower sacrificial core SC3"

may be formed in a position corresponding to that of the second photoresist pattern 192.

The first lower sacrificial cores SC1" may be formed on the first region R1' in a fourth space S1' while having a fourth width W1'. The first lower sacrificial cores SC1" may be formed in a fourth pitch P1'. The second lower sacrificial cores SC2" may be formed on the second region R2' in a fifth space S1' while having a fifth width W2'. The second lower sacrificial cores SC2" may be formed in a fifth pitch P2'. The third lower sacrificial core SC3" may have a sixth width W3', greater than the fourth width W1' and the fifth width W2'.

Figure 20:
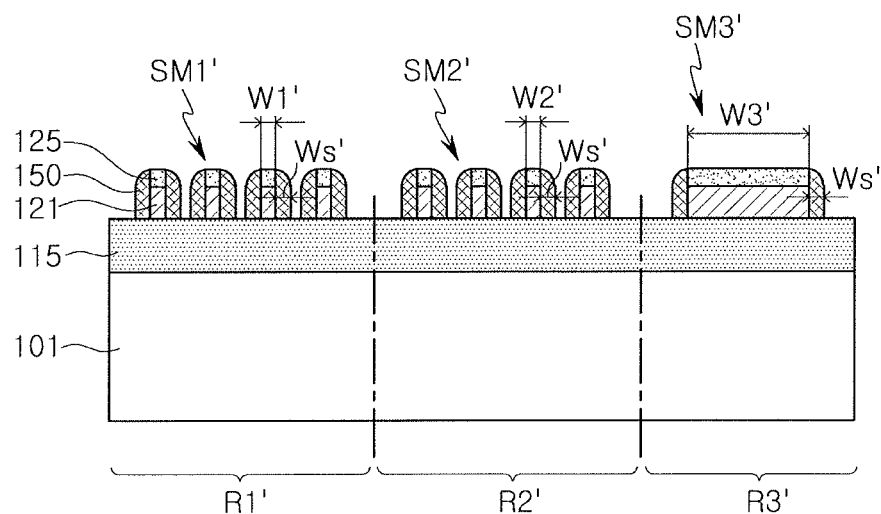

Referring to FIG. 20, second spacers 150 may be formed on side walls of the first lower sacrificial cores SC1", side walls of the second lower sacrificial cores SC2", and side walls of the third lower sacrificial core SC3". Thus, first mask structures SM1' may be formed on the first region R1', second mask structures SM2' may be formed on the second region R2', and a third mask structure SM3' may be formed on the third region R3'. Each of the first mask structures SM1', the second mask structures SM2', and the third mask structure SM3' may include a lower sacrificial layer 121, a lower antireflection layer 125, and a pair of second spacers 150.

In detail, a second spacer material layer, conformally covering the first lower sacrificial cores SC1", the second lower sacrificial cores SC2", and the third lower sacrificial core SC3", may be formed, and then an etchback process may be performed to form the second spacers 150 on side walls of the first lower sacrificial cores SC1", side walls of the second lower sacrificial cores SC2", and side walls of the third lower sacrificial core SC3".

A thickness of the second spacer material layer, that is, a width Ws' of the second spacers 150 may be determined in consideration of a width Wa' of the first active regions (AT1', see FIG. 23) to be ultimately formed. A width Wa' of the first active regions AT1', to be ultimately formed, may be smaller than a resolution limit of a commercially available photolithography equipment.

The second spacer material layer may be formed of a material having etch selectivity with respect to a material of the sacrificial layer 121. For example, when the sacrificial layer 121 may be formed of one among polycrystalline silicon, an amorphous carbon layer (ACL), or a spin-on hardmask (SOH), the second spacer material layer may be formed of a silicon oxide or a silicon nitride. The second spacer material layer may be formed using atomic layer deposition (ALD).

Figure 21:
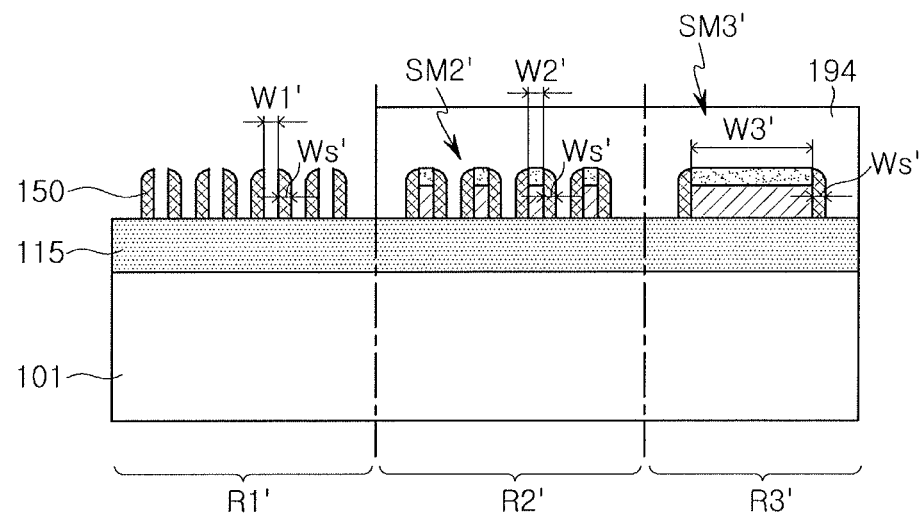

Referring to FIG. 21, a protective pattern 194, covering the second region R2' and the third region R3', may be provided. The protective pattern 194 may be formed of, for example, a photoresist material. The protective pattern 194 covers the second mask structures SM2' of the second region R2' and the third mask structure SM3' of the third region R3', and exposes the first mask structures SM1'.

By removing the first lower sacrificial cores SC1", second spacers 150, remaining on the hard mask layer 115 of the first region R1', may be provided. The second spacers 150 may be disposed in a space, equal to the fourth width W1' of the first lower sacrificial core SC1".

Figure 22:
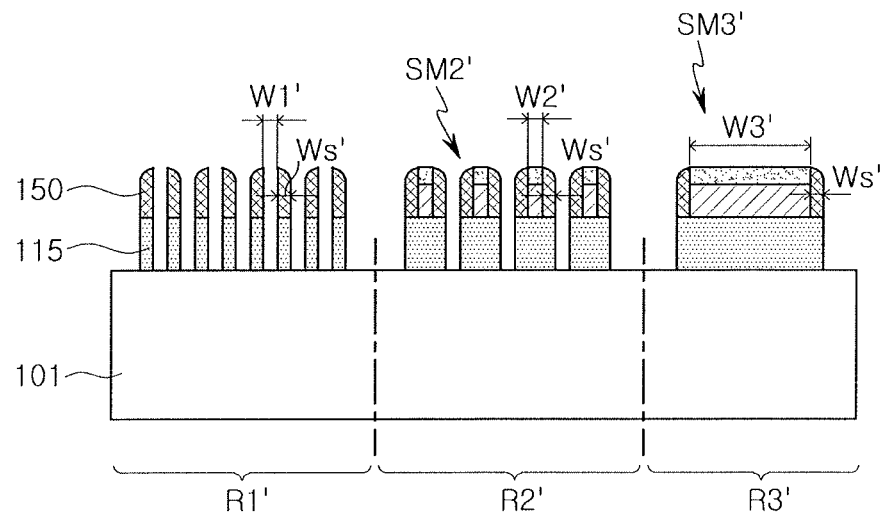

Referring to FIG. 22, a hard mask layer 115 may be anisotropically etched using second spacers 150 on the first region R1', a second mask structure SM2' on the second region R2', and a third mask structure SM3' on the third region R3' as an etching mask. While the hard mask layer 115 may be anisotropically etched, a portion or the entirety, of the second spacers 150, the second mask structure SM2', and the third mask structure SM3', may be consumed.

Figure 23:
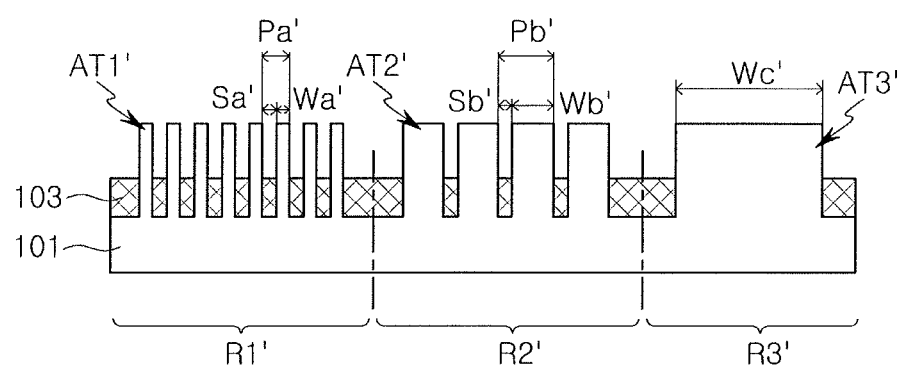

Referring to FIG. 23, the substrate 101 may be anisotropically etched using the patterned hard mask layer 115 as an etching mask, to form the first active region AT1' on the first region R1' of the substrate 101, to form the second active regions AT2' on the second region R2', and to form the third active region AT3' on the third region R3'. After anisotropic etching of the substrate 101 may be completed, a portion of the hard mask layer 115 may remain on the first to third active regions AT1', AT2', and AT3'.

A device isolation layer 103 may be formed to allow upper portions of the first to third active regions AT1', AT2', and AT3' to protrude. In detail, a space between the first to third active regions AT1', AT2', and AT3' may be filled with the device isolation layer 103. The hard mask layer 115, remaining on the first to third active regions AT1', AT2', and AT3', may be removed, and then a portion of the device isolation layer 103 may be etched to a predetermined depth to allow upper portions of the first to third active regions AT1', AT2', and AT3' to protrude.

By way of summation and review, an example embodiment provides a method of manufacturing a semiconductor device capable of forming fine patterns having widths different from each other. That is, according to example embodiments, a semiconductor device, including fine patterns (for example, active regions and gate patterns) having different widths may be manufactured, e.g., a wider active fin of a region in which an I/O transistor or a laterally diffused MOSFET (LDMOS) may be formed than that of a region in which a core transistor may be formed, without removing a mandrel. In other words, fine patterns having different widths may be formed simultaneously while using a same mandrel, i.e., by using the spacer formed on the side of the mandrel as a mask for the wider patterns. Thus, a single mandrel and two spacers in a side wall thereof may be used as an etch mask for a dry etch process, thereby improving the manufacturing process and providing a semiconductor device with excellent reliability.

Example embodiments have been disclosed herein, and although specific terms are employed, they may be used and may be to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming first sacrificial cores on a first region of a lower structure and second sacrificial cores on a second region of the lower structure, the first and second sacrificial cores having a same width;
   forming spacers on side walls of the first sacrificial cores and side walls of the second sacrificial cores;
   forming a protective pattern covering the second sacrificial cores on the second region of the lower structure;
   removing the first sacrificial cores from the first region; and etching the lower structure using the spacers on the first region, and the second sacrificial cores and the spacers on the second region.

2. The method of manufacturing a semiconductor device as claimed in claim 1, wherein:
the lower structure includes a semiconductor substrate, and
etching the lower structure includes:
forming first active regions having a first width in the first region, and
forming second active regions having a second width in the second region, such that the second width is greater than the first width.

3. The method of manufacturing a semiconductor device as claimed in claim 2, wherein the second width is greater than twice the first width.

4. The method of manufacturing a semiconductor device as claimed in claim 1, wherein:
the lower structure includes a gate conductive layer, and
etching the lower structure includes:
forming first gate patterns having a third width in the first region, and
forming second gate patterns having a fourth width greater than the third width in the second region.

5. The method of manufacturing a semiconductor device as claimed in claim 4, wherein the fourth width is greater than twice the third width.

6. The method of manufacturing a semiconductor device as claimed in claim 1, wherein a width of the spacers is equal to the width of the first and second sacrificial cores.

7. The method of manufacturing a semiconductor device as claimed in claim 1, wherein forming the first sacrificial cores and the second sacrificial cores includes forming a third sacrificial core on a third region of the lower structure, such that the third sacrificial core has a width wider than each of a width of the first sacrificial cores and a width of the second sacrificial cores.

8. The method of manufacturing a semiconductor device as claimed in claim 7, wherein forming the spacers on side walls of the first sacrificial cores and side walls of the second sacrificial cores includes forming the spacers on side walls of the third sacrificial core.

9. The method of manufacturing a semiconductor device as claimed in claim 8, wherein forming a protective pattern covering the second sacrificial cores on the second region of the lower structure includes forming the protective pattern covering the third sacrificial core on the third region.

10. The method of manufacturing a semiconductor device as claimed in claim 9, wherein etching the lower structure includes etching the lower structure using the spacers on the first region, the second sacrificial cores and the spacers on the second region, and the third sacrificial core and the spacers on the third region.

11. The method of manufacturing a semiconductor device as claimed in claim 10, wherein:
the lower structure includes a semiconductor substrate, and
etching the lower structure includes:
forming first active regions having a first width in the first region,
forming second active regions having a second width greater than the first width in the second region, and
forming a third active region having a third width greater than the second width in the third region.

12. The method of manufacturing a semiconductor device as claimed in claim 10, wherein:
the lower structure includes a gate conductive layer, and etching the lower structure includes:
forming first gate patterns having a fourth width in the first region,
forming second gate patterns having a fifth width greater than the fourth width in the second region, and
forming a third gate pattern having a sixth width greater than the fifth width in the third region.

13. A method of manufacturing a semiconductor device, the method comprising:
preparing a lower structure having a first region, a second region, and a third region;
forming a first sacrificial core having a first width on the first region, a second sacrificial core having a second width on the second region, and a third sacrificial core having a third width, greater than the first width and the second width, on the third region;
forming spacers on the first region of the lower structure, a first mask structure including the second sacrificial core and the spacers on the second region of the lower structure, and a second mask structure including the third sacrificial core and the spacers on the third region of the lower structure; and
etching the lower structure using the spacers, the first mask structure, and the second mask structure,
wherein the first width is equal to the second width, and a width of the spacers is equal to the first width.

14. The method of manufacturing a semiconductor device as claimed in claim 13, wherein forming the spacers, the first mask structure, and the second mask structure includes:
forming the spacers on side walls of the first sacrificial core, side walls of the second sacrificial core, and side walls of the third sacrificial core;
forming a protective pattern covering the second sacrificial core on the second region and the third sacrificial core on the third region;
removing the first sacrificial core from the first region; and
removing the protective pattern.

15. The method of manufacturing a semiconductor device as claimed in claim 13, wherein:
the lower structure includes a semiconductor substrate, and
etching the lower structure includes:
forming first active regions having a space equal to the first width, and having a width equal to a width of the spacers,
forming second active regions having a space equal to the second width, and having a width greater than the width of the first active regions, and
forming a third active region having a width greater than the width of the second active regions.

16. The method of manufacturing a semiconductor device as claimed in claim 13, wherein:
the lower structure includes a semiconductor substrate, and
etching the lower structure includes:
forming first active regions having the first width in the first region,
forming second active regions having a width equal to three times the first width in the second region, and
forming a third active region having a width greater than the width of the second active regions in the third region.

17. A method of manufacturing a semiconductor device, the method comprising:

stacking a lower sacrificial layer and an upper sacrificial layer on a lower structure having a first region, a second region, and a third region;

forming a first upper sacrificial core on the first region and a second upper sacrificial core on the second region by etching the upper sacrificial layer;

forming first spacers on side walls of the first upper sacrificial core and side walls of the second upper sacrificial core;

removing the first upper sacrificial core and the second upper sacrificial core;

forming a photoresist pattern having a width wider than a width of the first upper sacrificial core on the third region;

forming first lower sacrificial cores on the first region, second lower sacrificial cores on the second region, and a third lower sacrificial core on the third region, by etching the lower sacrificial layer using the first spacers and the photoresist pattern as an etching mask;

forming second spacers on side walls of first lower sacrificial cores, side walls of second lower sacrificial cores, and side walls of a third lower sacrificial core;

forming a protective pattern covering the second region and the third region;

removing the first lower sacrificial cores formed on the first region; and etching the lower structure using the second spacers on the first region, the second lower sacrificial cores and the second spacers on the second region, and the third lower sacrificial cores and the second spacers on the third region.

18. The method of manufacturing a semiconductor device as claimed in claim 17, wherein:

the lower structure includes a semiconductor substrate, and etching the lower structure includes:

forming first active regions having a first width in the first region, forming second active regions having a second width greater than the first width in the second region, and forming a third active region having a third width greater than the second width in the third region.

19. The method of manufacturing a semiconductor device as claimed in claim 18, wherein the second width is greater than twice the first width.

\* \* \* \* \*